United States Patent
Kim (12)

(10) Patent No.: US 10,325,669 B2
(45) Date of Patent: Jun. 18, 2019

(54) ERROR INFORMATION STORAGE CIRCUIT AND SEMICONDUCTOR APPARATUS INCLUDING THE SAME

(71) Applicant: SK hynix Inc., Icheon-si, Gyeonggi-do (KR)

(72) Inventor: Jong Sam Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/980,071

(22) Filed: May 15, 2018

(65) Prior Publication Data
US 2019/0130985 A1    May 2, 2019

(30) Foreign Application Priority Data
Oct. 30, 2017    (KR) .................. 10-2017-0142185

(51) Int. Cl.
| G11C 7/00 | (2006.01) |
| G11C 29/02 | (2006.01) |
| G11C 17/18 | (2006.01) |
| G11C 17/16 | (2006.01) |

(52) U.S. Cl.
CPC ............ G11C 29/027 (2013.01); G11C 17/16 (2013.01); G11C 17/18 (2013.01)

(58) Field of Classification Search
CPC ....... G11C 29/50; G11C 11/401; G11C 29/02; G11C 29/34
USPC ................... 365/201, 189.05, 225.7
See application file for complete search history.

(56) References Cited

U.S. PATENT DOCUMENTS

| 7,602,172 B2 | 10/2009 | Chung et al. | |
| 2002/0054507 A1* | 5/2002 | Makuta | G11C 29/789 365/185.09 |
| 2012/0075944 A1* | 3/2012 | Ide | G11C 29/44 365/200 |

* cited by examiner

Primary Examiner — Son T Dinh
(74) Attorney, Agent, or Firm — William Park & Associates Ltd.

(57) ABSTRACT

An error information storage circuit configured to write information stored in a plurality of fuse sets to a plurality of fuse latch sets of a core block and/or to write test data to the plurality of fuse latch sets. The test data is internally generated depending on a fuse clock signal, and the test data has values which cause opposite levels to be written in adjacent latches of the plurality of fuse latch sets.

16 Claims, 5 Drawing Sheets

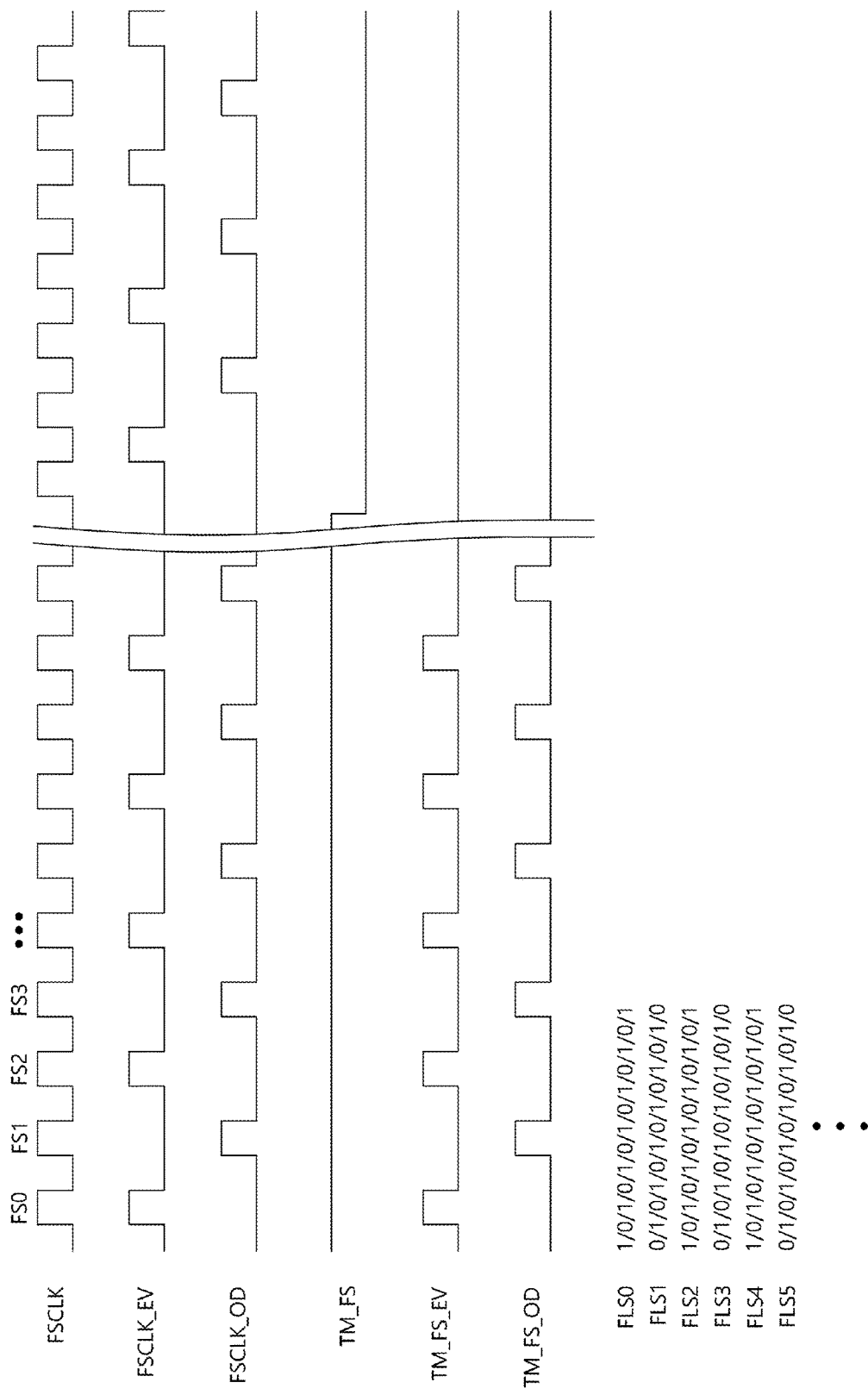

ERROR INFORMATION STORAGE CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2017-0142185, which was filed on Oct. 30, 2017, in the Korean Intellectual Property Office, and which is incorporated herein by reference in its entirety.

BACKGROUND

1. Technical Field

Various embodiments generally relate to a semiconductor circuit, and more particularly, to an error information storage circuit and a semiconductor apparatus including the same.

2. Related Art

In a semiconductor apparatus, a memory cell in which an error has occurred (hereinafter, an error cell) may be detected through a test.

In an operation of a semiconductor circuit, in the case where an address provided from an exterior entity is an address for accessing an error cell, a redundant memory cell (hereinafter, a redundant cell) allocated to the error cell is accessed instead of the error cell. This may be referred to as a repair operation.

Address information for accessing an error cell may be referred to as error information, and the error information may be stored in a fuse set.

Currently, detecting error cells through testing often involve a level of complexity that can increase a time duration for performing the test.

SUMMARY

Various embodiments are directed to an error information storage circuit and a semiconductor apparatus including the same, capable of improving the test performance of a fuse latch set.

In an embodiment, a method performed by an error information storage circuit includes at least one of writing information stored in a plurality of fuse sets to a plurality of fuse latch sets of a core block and writing test data internally generated depending on a fuse clock signal to the plurality of fuse latch sets. The test data has values which cause opposite levels to be written in adjacent latches of the plurality of fuse latch sets.

In one case, writing the test data to the plurality of fuse latch sets is performed during a boot-up process of a semiconductor apparatus that includes the error information storage circuit. In another case, writing the information stored in the plurality of fuse sets to the plurality of fuse latch sets of the core block is in response to deactivation of a test mode signal. Further, writing the test data, which is internally generated depending on a fuse clock signal, to the plurality of fuse latch sets is in response to activation of the test mode signal.

In an additional embodiment, an error information storage circuit includes a clock generation circuit configured to generate a first clock signal and a second clock signal depending on a fuse clock signal. The error information storage circuit further includes a control signal generation circuit configured to generate a first control signal and a second control signal depending on a test mode signal, the first clock signal, and the second clock signal. The error information storage circuit also includes a data control circuit configured to write test data in a plurality of fuse latch sets of a core block depending on the test mode signal. The test data is internally generated using the first control signal and the second control signal, and the test data has values which cause opposite levels to be written in adjacent latches of the plurality of fuse latch sets. In one case, the data control circuit is configured to write the information stored in the plurality of fuse sets to the plurality of fuse latch sets in response to deactivation of the test mode signal.

In another embodiment, a semiconductor apparatus includes a memory region including a plurality of fuse latch sets and an error information storage circuit. The error information storage circuit is configured to at least one of write information stored in a plurality of fuse sets to the plurality of fuse latch sets and write test data internally generated depending on a fuse clock signal to the plurality of fuse latch sets. The test data has values which cause opposite levels to be written in adjacent latches of the plurality of fuse latch sets, and a boot-up counter configured to sequentially select the plurality of fuse latch sets depending on the fuse clock signal.

BRIEF DESCRIPTION OF THE DRAWINGS

FIG. 7 is a timing diagram relating to a test data write method, in accordance with an embodiment of the present disclosure.

DETAILED DESCRIPTION

An error information storage circuit and a semiconductor apparatus including the same is described below with reference to the accompanying drawings and through various presented embodiments.

Figure 1:
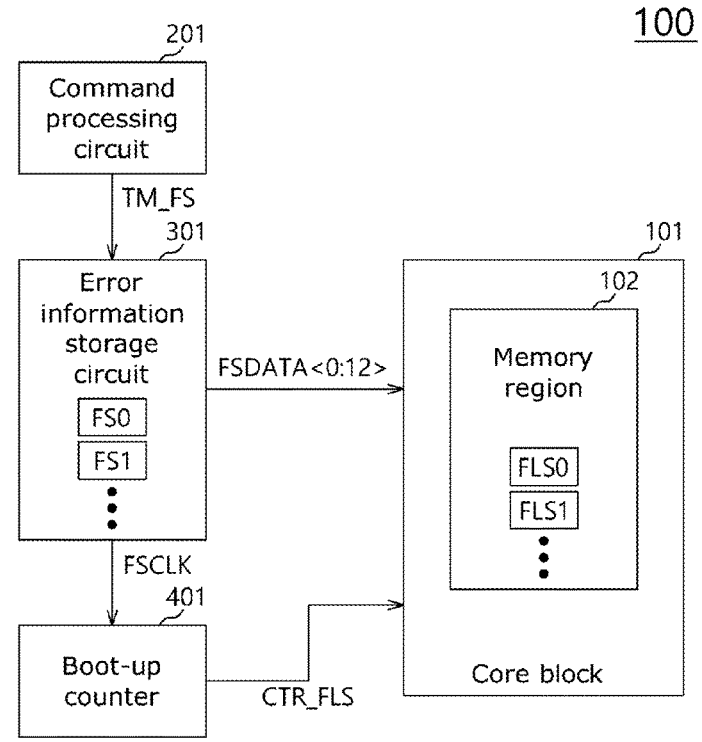
FIG. 1 is a diagram illustrating a configuration of a semiconductor apparatus in accordance with an embodiment of the present disclosure.

FIG. 1 is a diagram illustrating a configuration of a semiconductor apparatus 100 in accordance with an embodiment.

As shown in FIG. 1, the semiconductor apparatus 100 may include a core block 101, a command processing circuit 201, an error information storage circuit 301, and a boot-up counter 401.

The core block 101 may include a memory region 102.

The memory region 102 may include, for example, a plurality of memory banks.

The memory region 102 may include a plurality of fuse latch sets FLS0~. The tilde, as used herein, indicates a range with respect to a plurality of elements. For example, FLS0~ indicates the plurality of fuse latch sets represented in FIG. 1 as FLS0, FLS1, . . . .

The plurality of fuse latch sets FLS0~ may be configured in the plurality of memory banks, respectively.

The plurality of fuse latch sets FLS0~ may be stored with fuse data FSDATA<0:12> as respective fuse latches are sequentially selected depending on a latch set select signal CTR_FLS.

Each of the plurality of fuse latch sets FLS0~ may include a plurality of latches.

The plurality of latches may have an initial value of a low level in an unused state, that is, before error information is stored therein.

While not shown, the core block 101 may include various circuit components associated with the data input/output of the memory region 102.

The command processing circuit 201 may generate a test mode signal TM_FS by decoding an external command.

The test mode signal TM_FS may be a signal for testing whether the plurality of fuse latch sets FLS0~ have an error.

The error information storage circuit 301 may include a plurality of fuse sets FS0~.

The plurality of fuse sets FS0~ may correspond to the plurality of fuse latch sets FLS0~ in a one-to-one relationship.

The error information storage circuit 301 may store error information stored in the plurality of fuse sets FS0~ to the plurality of fuse latch sets FLS0~, as the fuse data FSDATA<0:12>, in a boot-up operation of the semiconductor apparatus 100.

The error information storage circuit 301 may generate test data for causing opposite levels to be written in adjacent latches of the plurality of fuse latch sets FLS0~ by using a fuse clock signal FSCLK, according to one input of the test mode signal TM_FS. As used herein, "write/writing/written in" is used interchangeably with "write/writing/written to." For instance, writing data in a fuse latch set is equivalent with writing the data to the fuse latch set.

The test data may be data internally generated, regardless of the error information stored in the plurality of fuse sets FS0~.

The boot-up counter 401 may generate the latch set select signal CTR_FLS for sequentially selecting the plurality of fuse latch sets FLS0~, depending on the fuse clock signal FSCLK.

Figure 2:
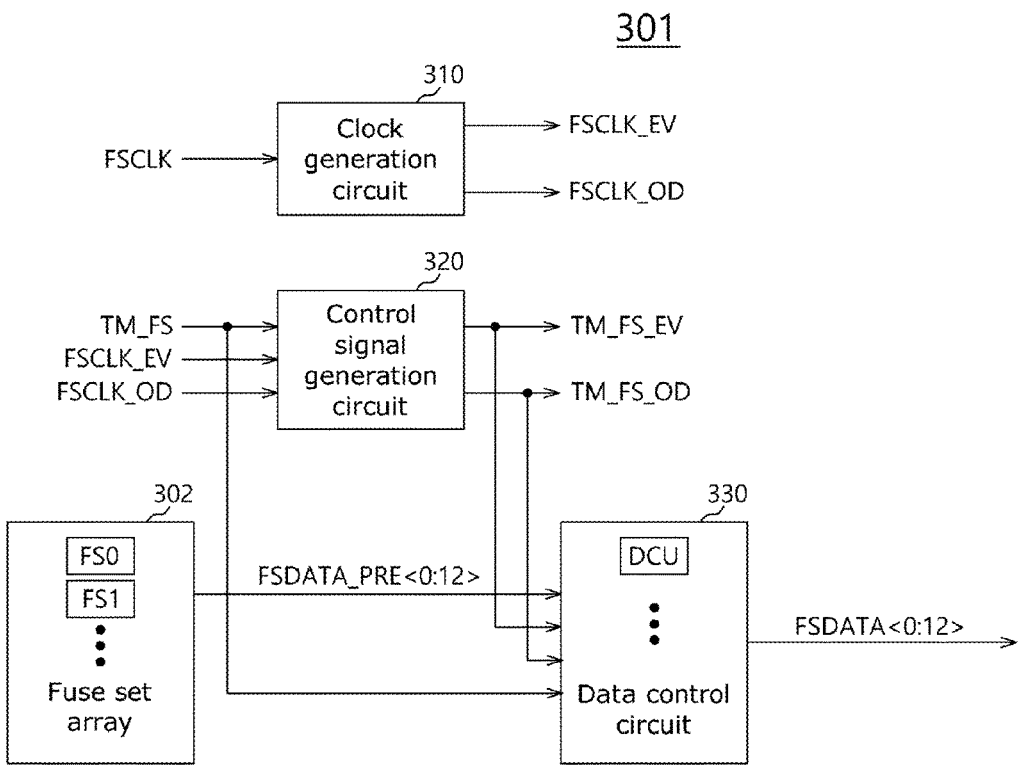
FIG. 2 is a diagram illustrating a configuration of the error information storage circuit shown in FIG. 1, in accordance with an embodiment of the present disclosure.

FIG. 2 is a diagram illustrating a configuration of the error information storage circuit 301 shown in FIG. 1.

As shown in FIG. 2, the error information storage circuit 301 may include a fuse set array 302, a clock generation circuit 310, a control signal generation circuit 320, and a data control circuit 330.

The fuse set array 302 may include the plurality of fuse sets FS0~.

Each fuse set of the plurality of fuse sets FS0~ may include a plurality of fuses.

Error information determined through a test, that is, an address for accessing an error cell, may be stored in each of the is plurality of fuse sets FS0~.

Each of the plurality of fuse sets FS0~ may output the information stored therein as pre-fuse data FSDATA_PRE<0:12>.

An operation of outputting the pre-fuse data FSDATA_PRE<0:12> from each of the plurality of fuse sets FS0~ may be performed in a boot-up process of the semiconductor apparatus 100.

The clock generation circuit 310 may generate a first clock signal FSCLK_EV and a second clock signal FSCLK_OD depending on the fuse clock signal FSCLK.

The clock generation circuit 310 may generate the first clock signal FSCLK_EV or the second clock signal FSCLK_OD by identifying the fuse clock signal FSCLK into an even number and an odd number. For example, by identifying whether the fuse clock signal FSCLK is an even number or an odd number, respectively.

The control signal generation circuit 320 may generate control signals, that is, a first control signal TM_FS_EV and a second control signal TM_FS_OD, depending on the test mode signal TM_FS, the first clock signal FSCLK_EV, and the second clock signal FSCLK_OD.

The data control circuit 330 may generate the fuse data FSDATA<0:12> depending on the test mode signal TM_FS, the pre-fuse data FSDATA_PRE<0:12>, the first control signal TM_FS_EV, and the second control signal TM_FS_OD.

The data control circuit 330 may output the pre-fuse data FSDATA_PRE<0:12> as the fuse data FSDATA<0:12> or may output the test data internally generated depending on the first control signal TM_FS_EV and the second control signal TM_FS_OD as the fuse data FSDATA<0:12>, depending on the test mode signal TM_FS.

The test data may have values which cause opposite levels to be written in adjacent latches of the plurality of fuse latch sets FLS0~ of the core block 101.

The data control circuit 330 may include a plurality of data control units DCU.

Figure 3:
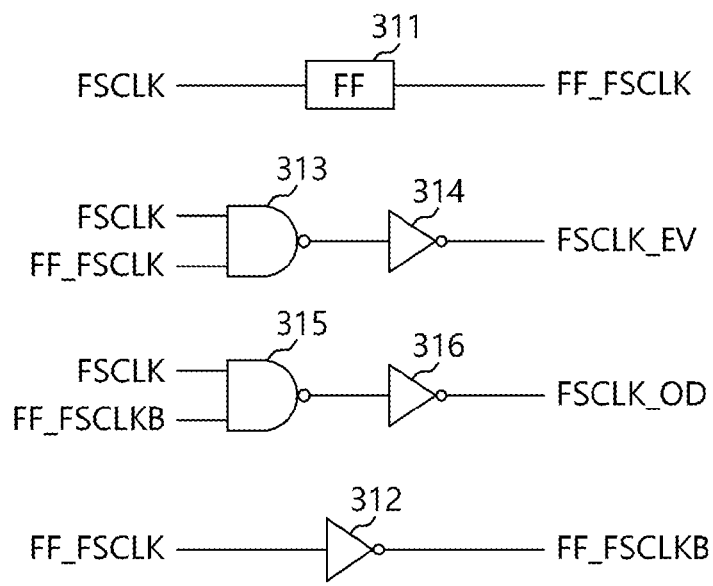
FIG. 3 is a diagram illustrating a configuration of the clock generation circuit shown in FIG. 2, in accordance with an embodiment of the present disclosure.

FIG. 3 is a diagram illustrating a configuration of the clock generation circuit 310 shown in FIG. 2.

As shown in FIG. 3, the clock generation circuit 310 may include a flip-flop (FF) 311 and first, second, third, fourth, and fifth logic gates 312, 313, 314, 315, and 316, respectively.

The flip-flop 311 may latch the fuse clock signal FSCLK and generate a latched clock signal FF_FSCLK.

The first logic gate 312 may invert the latched clock signal FF_FSCLK and generate an inverted latched clock signal FF_FSCLKB.

The second logic gate 313 may NAND the fuse clock signal FSCLK and the latched clock signal FF_FSCLK and output an output signal. As used herein, NAND refers to the logic NAND function "Not AND."

The third logic gate 314 may invert the output signal of the second logic gate 313 and output the first clock signal FSCLK_EV.

The fourth logic gate 315 may NAND the fuse clock signal FSCLK and the inverted latched clock signal FF_FSCLKB and output an output signal.

The fifth logic gate 316 may invert the output signal of the fourth logic gate 315 and output the second clock signal FSCLK_OD.

Figure 4:
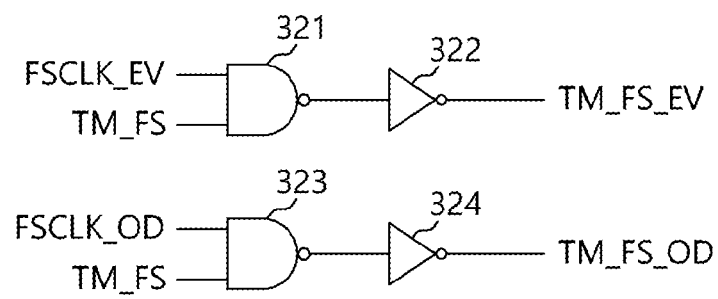
FIG. 4 is a diagram illustrating a configuration of the control signal generation circuit shown in FIG. 2, in accordance with an embodiment of the present disclosure.

FIG. 4 is a diagram illustrating a configuration of the control signal generation circuit 320 shown in FIG. 2.

As shown in FIG. 4, the control signal generation circuit 320 may include first, second, third, and fourth logic gates 321, 322, 323, and 324, respectively.

The first logic gate 321 may NAND the test mode signal TM_FS and the first clock signal FSCLK_EV and output an output signal.

The second logic gate 322 may invert the logic level of the output signal of the first logic gate 321 and output the first control signal TM_FS_EV.

The first and second logic gates 321 and 322 may output the first clock signal FSCLK_EV as the first control signal TM_FS_EV in the case where the test mode signal TM_FS is activated to a high level.

The third logic gate 323 may NAND the test mode signal TM_FS and the second clock signal FSCLK_OD and output an output signal.

The fourth logic gate 324 may invert the logic level of the output signal of the third logic gate 323 and output the second control signal TM_FS_OD.

The third and fourth logic gates 323 and 324 may output the second clock signal FSCLK_OD as the second control signal TM_FS_OD in the case where the test mode signal TM_FS is activated to the high level.

Figure 5:
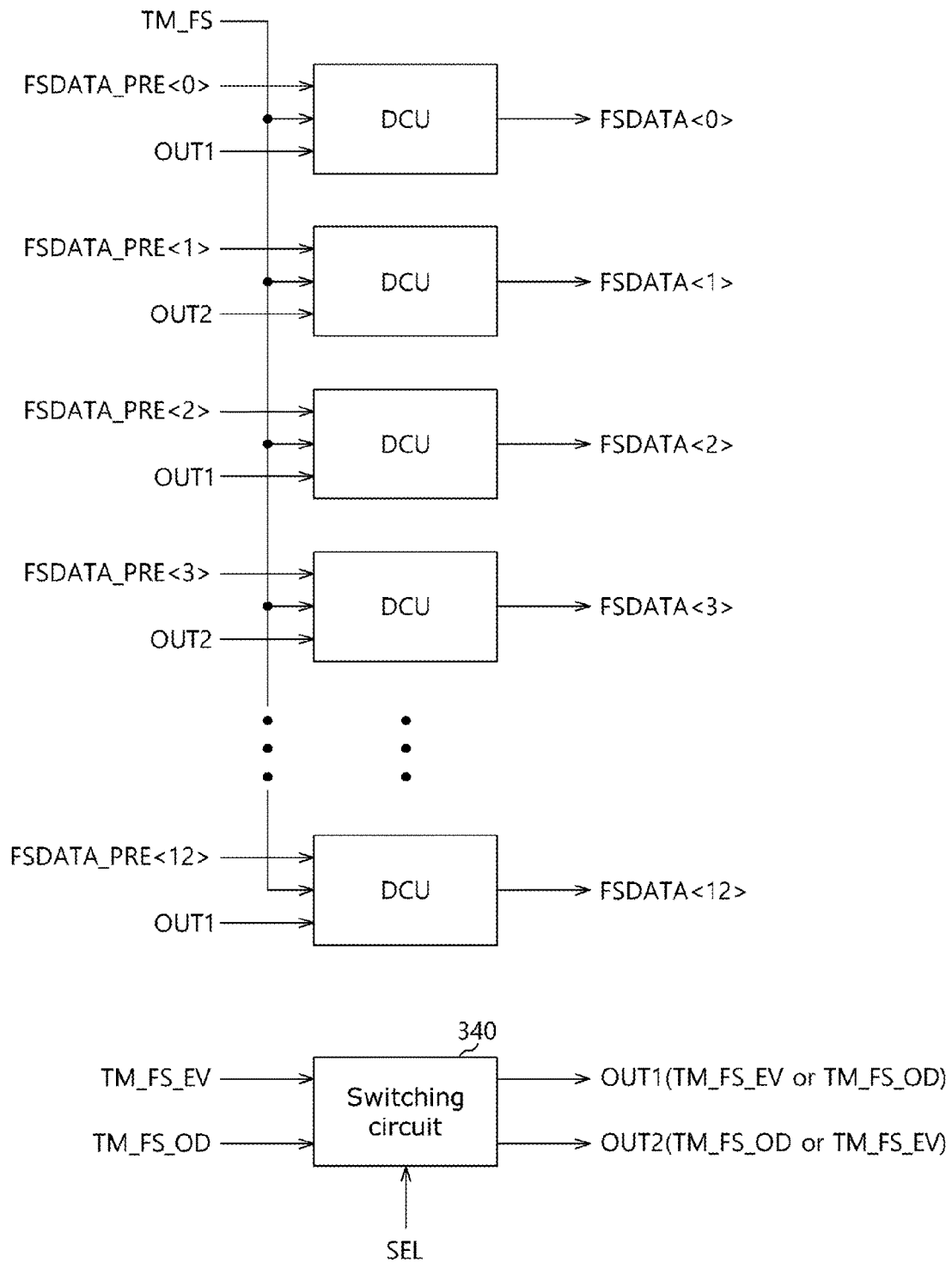
FIG. 5 is a diagram illustrating a configuration of the data control circuit shown in FIG. 2, in accordance with an embodiment of the present disclosure.

FIG. 5 is a diagram illustrating a configuration of the data control circuit 330 shown in FIG. 2.

As shown in FIG. 5, the data control circuit 330 may include the plurality of data control units DCU and a switching circuit 340.

The switching circuit 340 may output the first control signal TM_FS_EV or the second control signal TM_FS_OD as a first output signal OUT1 and may output the second control signal TM_FS_OD or the first control signal TM_FS_EV as a second output signal OUT2, depending on a select signal SEL.

In a first example, if the select signal SEL is at a high level, then the switching circuit 340 may output the first control signal TM_FS_EV as the first output signal OUT1 and output the second control signal TM_FS_OD as the second output signal OUT2.

In a second example, if the select signal SEL is at a low level, then the switching circuit 340 may output the second control signal TM_FS_OD as the first output signal OUT1 and output the first control signal TM_FS_EV as the second output signal OUT2.

The select signal SEL may be generated by using a fuse set, a mode register set, or a test mode signal, according to an external command.

Each of the plurality of data control units DCU may receive one bit of the pre-fuse data FSDATA_PRE<0:12>, as indicated in FIG. 5.

The plurality of data control units DCU may all receive the test mode signal TM_FS.

Each of the plurality of data control units DCU may receive any one of the first output signal OUT1 and the second output signal OUT2.

The first output signal OUT1 may be inputted to data control units DCU, among the plurality of data control units DCU, which receive the even-numbered pre-fuse data FSDATA_PRE<0, 2, 4, 6, 8, 10, 12>.

The second output signal OUT2 may be inputted to data control units DCU, among the plurality of data control units DCU, which receive the odd-numbered pre-fuse data FSDATA_PRE<1, 3, 5, 7, 9, 11>.

Each of the plurality of data control units DCU may output one bit of the fuse data FSDATA<0:12>, as indicated in FIG. 5.

Figure 6:
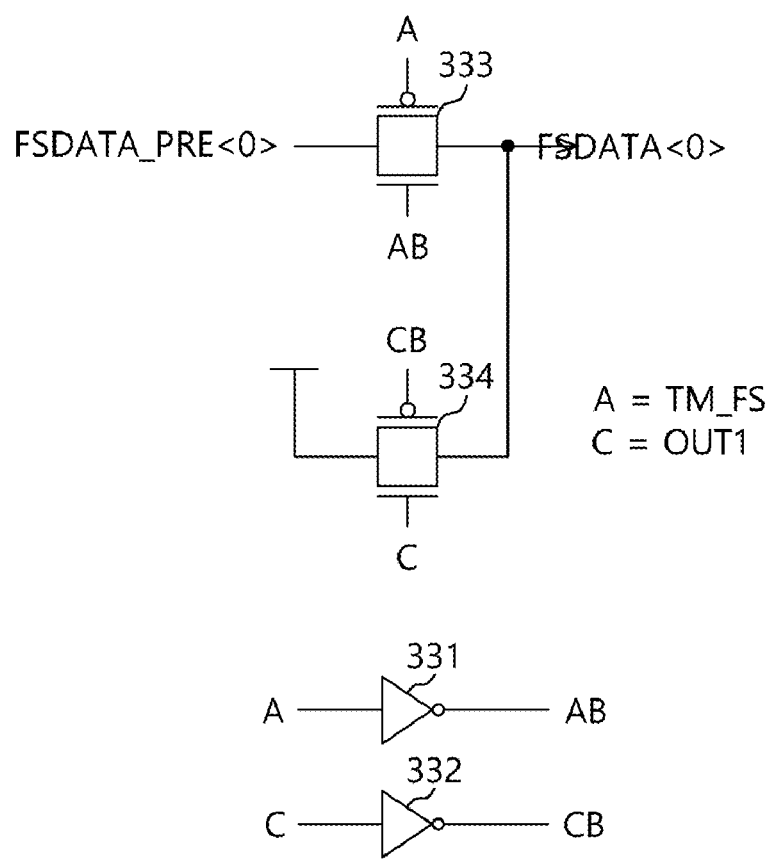
FIG. 6 is a diagram illustrating a configuration of the data control unit shown in FIG. 5, in accordance with an embodiment of the present disclosure.

FIG. 6 is a diagram illustrating a configuration of a data control unit DCU of the plurality of data control units DCU shown in FIG. 5.

As shown in FIG. 6, the data control unit DCU may include first, second, third, and fourth logic gates 331, 332, 333, and 334, respectively.

The first logic gate 331 may invert a signal 'A' and generate output 'AB.'

The second logic gate 332 may invert a signal 'C' and generate output 'CB.'

For an embodiment, the test mode signal TM_FS may be inputted as the signal 'A,' and the first output signal OUT1, i.e., the first control signal TM_FS_EV or the second control signal TM_FS_OD, may be inputted as the signal 'C.'

The third logic gate 333 may receive the signal 'A' through an inverting control terminal, receive the inverted signal 'AB' of the signal 'A' through a non-inverting control terminal, receive one bit, for example, the bit FSDATA_PRE<0>, among the pre-fuse data FSDATA_PRE<0:12> through an input terminal, and output one bit, in this case FSDATA<0>, among the fuse data FSDATA<0:12> through an output terminal.

The third logic gate 333 may output FSDATA_PRE<0> as FSDATA<0> in the case where the test mode signal TM_FS is deactivated to a low level.

The fourth logic gate 334 may receive the signal 'C' through a non-inverting control terminal, receive the inverted signal 'CB' of the signal 'C' through an inverting control terminal, be coupled with a power supply terminal through an input terminal, and output FSDATA<0> through an output terminal.

The fourth logic gate 334 may output a power supply level, that is, a high level, as FSDATA<0> in the case where the signal 'C' is activated to a high level.

FIG. 7 is a timing diagram relating to a test data write is method in accordance with an embodiment.

The test data write method in accordance with some embodiments will be described below with reference to FIGS. 1 to 7.

It is assumed, for a described embodiment, that the first control signal TM_FS_EV is selected as the first output signal OUT1 indicated in FIG. 5, and that the second control signal TM_FS_OD is selected as the second output signal OUT2 indicated in FIG. 5.

The first clock signal FSCLK_EV and the second clock signal FSCLK_OD may be generated depending on the fuse clock signal FSCLK.

While the test mode signal TM_FS is activated, the first control signal TM_FS_EV may be activated based on the first clock signal FSCLK_EV, and the second control signal TM_FS_OD may be activated based on the second clock signal FSCLK_OD.

In accordance with the first pulse of the fuse clock signal FSCLK, the boot-up counter 401 selects a fuse latch set corresponding to any one among the plurality of fuse sets FS0~ of the fuse set array 302, for example, the fuse latch set FLS0 corresponding to the first fuse set FS0, by using the latch set select signal CTR_FLS.

Since the first control signal TM_FS_EV is also activated for the activation period of the first pulse of the fuse clock signal FSCLK, the data control units DCU, among the plurality of data control units DCU of the data control circuit 330, which receive the first output signal OUT1, that is, the first control signal TM_FS_EV, generate test is data by using the power supply level, that is, generate the even-numbered fuse data FSDATA<0, 2, 4, 6, 8, 10, 12> to the high level.

Meanwhile, the second output signal OUT2, that is, the second control signal TM_FS_OD, is in a deactivated state for the activation period of the first pulse of the fuse clock signal FSCLK. Therefore, the outputs of the data control units DCU which receive the second output signal OUT2 are cut off.

Thus, a high level '1' is written in even-numbered latches among the latches of the fuse latch set FLS0 corresponding to the first fuse set FS0, and odd-numbered latches retain a low level '0.' As a result, 1/0/1/0/1/0/1/0/1/0/1/0/1 may be stored in the fuse latch set FLS0.

In accordance with the second pulse of the fuse clock signal FSCLK, the boot-up counter 401 selects the fuse latch set FLS1, corresponding to the second fuse set FS1 in the fuse set array 302, by using the latch set select signal CTR_FLS.

Because the first control signal TM_FS_EV is in a deactivated state for the activation period of the second pulse of the fuse clock signal FSCLK, the outputs of the data control units DCU among the plurality of data control units DCU of the data control circuit 330 which receive the first output signal OUT1, that is, the first control signal TM_FS_EV, are cut off.

Conversely, because the second output signal OUT2, that is, the second control signal TM_FS_OD, is activated for the activation period of the second pulse of the fuse clock signal FSCLK, the data control units DCU which receive the second output signal OUT2 generate test data by using the power supply level, that is, they generate the odd-numbered fuse data FSDATA<1, 3, 5, 7, 9, 11> to the high level.

Thus, the even-numbered latches among the latches of the fuse latch set FLS1 corresponding to the second fuse set FS1 retain the low level '0,' and the odd-numbered latches are written with the high level '1.' As a result, 0/1/0/1/0/1/0/1/0/1/0/1/0 may be stored in the fuse latch set FLS1.

By repeating the above-described method according to the successive pulses of the fuse clock signal FSCLK, the operation of writing test data may be performed such that adjacent latches in the remaining fuse latch sets FLS2~ have different levels.

As a result, for an embodiment, it is possible to cause adjacent latches to have different levels, not only for each of the plurality of fuse sets FS0~, but also for the entirety of the plurality of fuse sets FS0~.

As described above, in accordance with embodiments of the present disclosure, an error information storage circuit includes a clock generation circuit configured to generate a first clock signal and a second clock signal depending on a fuse clock signal. The error information storage circuit further includes a control signal generation circuit configured to generate a first control signal and a second control signal depending on a test mode signal, the first clock signal, and the second clock signal. The error information storage circuit also includes a data control circuit configured to write test data in a plurality of fuse latch sets of a core block depending on the test mode signal. The test data is internally generated using the first control signal and the second control signal, and the test data has values which cause opposite levels to be written in adjacent latches of the plurality of fuse latch sets.

In a first embodiment, the error information storage circuit further includes a plurality of fuse sets configured to output pre-fuse data, and the data control circuit is further configured to write the pre-fuse data in the plurality of fuse latch sets in response to deactivation of the test mode signal.

For a second embodiment, the clock generation circuit is further configured to output the first clock signal and the second clock signal by identifying the fuse clock signal into an even number and an odd number.

For a third embodiment, the control signal generation circuit is further configured to output the first clock signal as the first control signal and to output the second clock signal as the second control signal, in the case where the test mode signal is activated.

For a fourth embodiment, the data control circuit includes a switching circuit configured to output any one of the first control signal and the second control signal as a first output signal and to output the other control signal as a second output signal, depending on a select signal. The data control circuit also includes a plurality of data control units configured to all receive the test mode signal, and to receive any one of the first output signal and the second output signal by being divided into even numbers and odd numbers. In some instances, each data control unit includes a first logic gate, configured to output information stored in a fuse set of the plurality of fuse sets in response to deactivation of the test mode signal, and a second logic gate, configured to output a level of a power supply terminal in response to activation of any one of the first output signal and the second output signal.

In a case where the same data, for example, '1,' is written in all the fuse latch sets FLS0~, the reliability of detecting a failure substantially deteriorates as compared to above-described embodiments.

However, writing test data such that adjacent latches have different levels, because a test mode should be changed at each time of writing test data in each fuse latch set, can complicate a test operation and increase a time duration for performing the test operation.

For disclosed embodiments, because it is possible to cause, by only one input of a test mode, adjacent latches to have different levels, not only for each of the plurality of fuse sets FS0~ but also for the entirety of the plurality of fuse sets FS0~, the reliability of a test may be improved and the time duration to perform the test may be shortened.

While various embodiments have been described above, it will be understood to those skilled in the art that the described is embodiments serve only as examples from a larger set of possible embodiments. Accordingly, no limitations should be read into the error information storage circuit and the semiconductor apparatus including the same based on the described embodiments.

What is claimed is:

1. An error information storage circuit configured to at least one of write information stored in a plurality of fuse sets to a plurality of fuse latch sets of a core block and write test data internally generated depending on a fuse clock signal, in the plurality of fuse latch sets,
wherein the test data has values which cause opposite levels to be written in adjacent latches of the plurality of fuse latch sets.

2. The error information storage circuit according to claim 1, wherein an operation of writing the test data in the plurality of fuse latch sets is performed in a boot-up process of a semiconductor apparatus, wherein the semiconductor apparatus comprises the error information storage circuit.

3. The error information storage circuit according to claim 1, wherein the error information storage circuit is configured to write the information stored in the plurality of fuse sets to the plurality of fuse latch sets in response to deactivation of a test mode signal, and store the test data to the plurality of fuse latch sets in response to activation of the test mode signal.

4. An error information storage circuit comprising:
a clock generation circuit configured to generate a first clock signal and a second clock signal depending on a fuse clock signal;

a control signal generation circuit configured to generate a first control signal and a second control signal depending on a test mode signal, the first clock signal, and the second clock signal; and a data control circuit configured to write test data in a plurality of fuse latch sets of a core block depending on the test mode signal, wherein the test data is internally generated using the first control signal and the second control signal, and wherein the test data has values which cause opposite levels to be written in adjacent latches of the plurality of fuse latch sets.

5. The error information storage circuit of claim 4 further comprising:

a plurality of fuse sets configured to output pre-fuse data, wherein the data control circuit is further configured to write the pre-fuse data in the plurality of fuse latch sets in response to deactivation of the test mode signal.

6. The error information storage circuit of claim 4, wherein the clock generation circuit is further configured to output the first clock signal and the second clock signal by identifying the fuse clock signal into an even number and an odd number.

7. The error information storage circuit of claim 4, wherein the control signal generation circuit is further configured to output the first clock signal as the first control signal and to output the second clock signal as the second control signal, in the case where the test mode signal is activated.

8. The error information storage circuit of claim 4, wherein the data control circuit comprises:

a switching circuit configured to output any one of the first control signal and the second control signal as a first output signal and to output the other control signal as a second output signal, depending on a select signal; and a plurality of data control units configured to all receive the test mode signal, and to receive any one of the first output signal and the second output signal by being divided into even numbers and odd numbers.

9. The error information storage circuit of claim 8, wherein each data control unit comprises:

a first logic gate configured to output information stored in a fuse set of the plurality of fuse sets in response to deactivation of the test mode signal; and a second logic gate configured to output a level of a power supply terminal in response to activation of any one of the first output signal and the second output signal.

10. A semiconductor apparatus comprising:

a memory region including a plurality of fuse latch sets;

an error information storage circuit configured to at least one of write information stored in a plurality of fuse sets to the plurality of fuse latch sets and write test data internally generated depending on a fuse clock signal to the plurality of fuse latch sets, wherein the test data has values which cause opposite levels to be written in adjacent latches of the plurality of fuse latch sets; and a boot-up counter configured to sequentially select the plurality of fuse latch sets depending on the fuse clock signal.

11. The semiconductor apparatus of claim 10, wherein the error information storage circuit comprises:

a clock generation circuit configured to generate a first clock signal and a second clock signal depending on the fuse clock signal;

a control signal generation circuit configured to generate a first control signal and a second control signal depending on a test mode signal, the first clock signal, and the second clock signal; and a data control circuit configured to write the test data in the plurality of fuse latch sets depending on the test mode signal, wherein the test data is internally generated by using the first control signal and the second control signal.

12. The semiconductor apparatus of claim 11, wherein the data control circuit is configured to write the information stored in the plurality of fuse sets to the plurality of fuse latch sets in response to deactivation of the test mode signal.

13. The semiconductor apparatus of claim 11, wherein the clock generation circuit is configured to output the first clock signal and the second clock signal by identifying the fuse clock signal into an even number and an odd number.

14. The semiconductor apparatus of claim 11, wherein the control signal generation circuit is further configured to output the first clock signal as the first control signal and to output the second clock signal as the second control signal, in the case where the test mode signal is activated.

15. The semiconductor apparatus of claim 11, wherein the data control circuit comprises:

a switching circuit configured to output any one of the first control signal and the second control signal as a first output signal and to output the other control signal as a second output signal, depending on a select signal; and a plurality of data control units configured to all receive the test mode signal, and to receive any one of the first output signal and the second output signal by being divided into even numbers and odd numbers.

16. The semiconductor apparatus of claim 15, wherein each data control unit comprises:

a first logic gate configured to output information stored in a fuse set of the plurality of fuse sets in response to deactivation of the test mode signal; and a second logic gate configured to output a level of a power supply terminal in response to activation of any one of the first output signal and the second output signal.

* * * * *